United States Patent
Zheng et al.

(10) Patent No.: US 7,030,484 B1
(45) Date of Patent: Apr. 18, 2006

(54) LIDLESS CHIP PACKAGE EFFECTIVELY HAVING CO-PLANAR FRAME AND SEMICONDUCTOR DIE SURFACES

(75) Inventors: Wen-Chun Zheng, San Jose, CA (US); Henry Jung, Cupertino, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/824,455

(22) Filed: Apr. 14, 2004

(51) Int. Cl.
*H01L 23/34* (2006.01)

(52) U.S. Cl. ...................... 257/706; 257/717

(58) Field of Classification Search .............. 257/706, 257/717, 718, 720, 796, 675
See application file for complete search history.

(56) References Cited

U.S. PATENT DOCUMENTS

| | | | |
|---|---|---|---|
| 6,501,658 B1 * | 12/2002 | Pearson et al. | 361/709 |
| 2002/0137369 A1 * | 9/2002 | Edwards et al. | 439/77 |
| 2003/0085453 A1 * | 5/2003 | Eyman et al. | 257/678 |

* cited by examiner

*Primary Examiner*—Douglas W Owens
(74) *Attorney, Agent, or Firm*—Osha Liang LLP

(57) ABSTRACT

A "lidless" integrated circuit package includes a support member that is arranged to support at least part of a load placed on the integrated circuit package. The support member has or is connected to a flexible support device that is in supportive contact with the load and that is designed to flex dependent on a position of the support member. The flexible support device substantially ensures that a plane of the surface of the flexible support device and a plane of a surface of a semiconductor die of the integrated circuit package are co-planar, thereby leading to a desirable load distribution within the integrated circuit package.

18 Claims, 4 Drawing Sheets

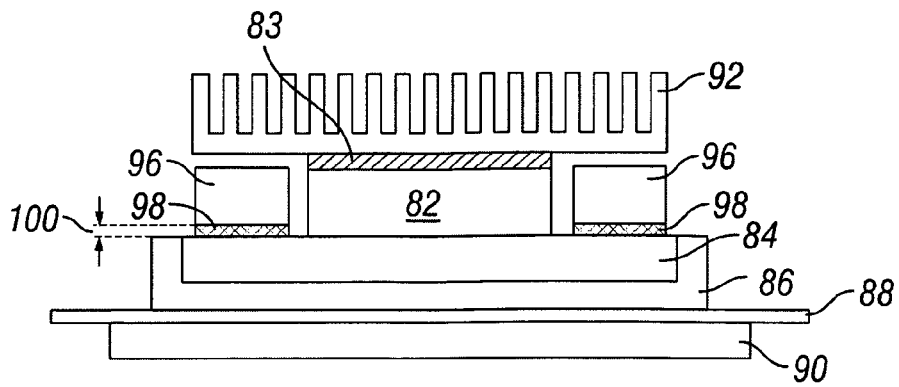
FIG. 5B
*(Prior Art)*
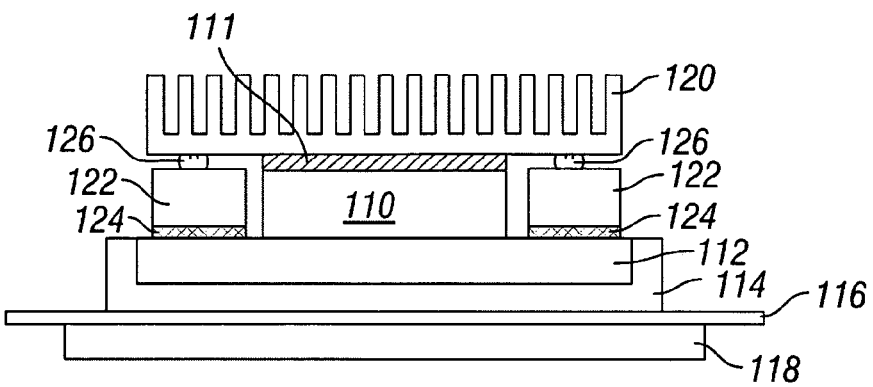
FIG. 6
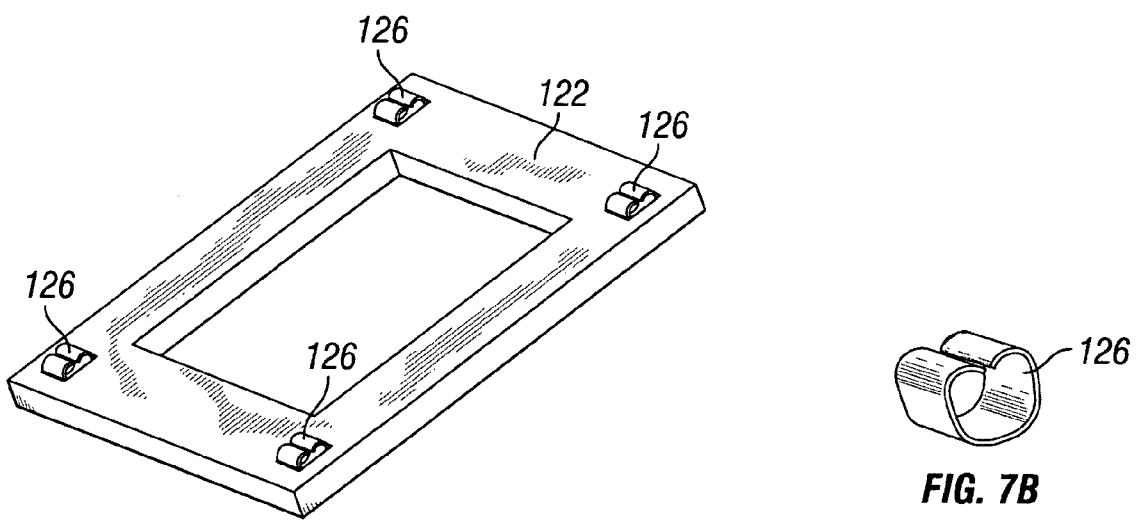
FIG. 7A
FIG. 7B

US 7,030,484 B1

LIDLESS CHIP PACKAGE EFFECTIVELY HAVING CO-PLANAR FRAME AND SEMICONDUCTOR DIE SURFACES

BACKGROUND OF INVENTION

A typical computer system 10, as shown in FIG. 1, includes several components that are collectively used by a user to perform various functions such as, for example, preparing and generating a document with a word processor application. With the computer system 10, the user may input data to a computing portion 12 using peripheral devices such as a keyboard 14 or a mouse 16. Data may also be provided to the computing portion 12 using data storage media, e.g., a floppy disk or a CD-ROM (not shown). The computing portion 12, using memory and other internal components, processes both internal data and data provided to the computing portion 12 by the user to generate data requested by the user. The generated data may be provided to the user via, for example, a display device 18 or a printer 20.

The computing portion 12 of a computer system typically includes various components such as, for example, a power supply, disk drives, and the electrical circuitry required to perform the necessary and requested operations of the computer system. As shown in FIG. 2, the computing portion 12 may contain a plurality of circuit boards 22, 24, 26, 28 (e.g., printed circuit boards (PCBs) or printed wiring boards (PWBs)) on which various circuit components are implemented. For example, a computing portion designed to have enhanced sound reproducing capabilities may have a circuit board dedicated to implementing circuitry that specifically operate to process data associated with the reproduction of sound.

In FIG. 2, the components of exemplary circuit board 22 are shown. A crystal oscillator 30 provides a reference of time to various integrated circuits (ICs) 32, 34, 36, 38, 40, 42 (e.g., application specific integrated circuits (ASICs), field-programmable gate arrays (FPGAs), microprocessors, logic gates) that are connected to the circuit board 22. The integrated circuits 32, 34, 36, 38, 40, 42 communicate with one another, i.e., pass data, using wires or traces of conductive material (e.g., copper (shown, but not labeled)) embedded in the circuit board 22.

Integrated circuits, such as the ones shown in FIG. 2, are fabricated on delicate and highly sensitive semiconductor dies. Thus, in order to protect a semiconductor die from, for example, adverse environmental variables, the semiconductor die, along with the integrated circuit fabricated thereon, are electrically packaged so as to form a component referred to as an "integrated circuit package" or a "chip package." Such a package is then mounted to a circuit board and essentially serves as an electrical interface between the integrated circuit fabricated on the semiconductor die and the circuit board by means of which the various integrated circuits on the circuit board communicate. For example, as shown in FIG. 2, each of the shown integrated circuits 32, 34, 36, 38, 40, 42 represent integrated circuit packages to which the actual data storing and processing circuitry (fabricated on semiconductor dies (not shown)) are associated.

Integrated circuit packages provide both mechanical support and environmental protection for the integrated circuits housed in the integrated circuit packages. Further, such integrated circuit packages are designed to provide signal and power distribution to the integrated circuit(s) contained therein. Integrated circuit packages may also be beneficial for dissipating heat generated by their respective integrated circuits.

SUMMARY OF INVENTION

According to one aspect of one or more embodiments of the present invention, an apparatus comprises: a substrate; a semiconductor die disposed on the substrate and having an integrated circuit electrically connected to the substrate; a load source, at least part of which is disposed over and in operative contact with semiconductor die; and a support member disposed on the substrate, where the support member comprises a flexible support device in operative contact with the load source.

According to another aspect of one or more embodiments of the present invention, a computer system comprises: a circuit board; a substrate electrically connected to the circuit board, where the substrate has electrically conductive paths arranged to pass signals between the circuit board and an integrated circuit; a semiconductor die disposed on the substrate and having the integrated circuit fabricated thereon, where a load source is disposed over the semiconductor die; and a support member attached to the substrate and connected to a flexible support device in supportive contact with the load source.

According to another aspect of one or more embodiments of the present invention, an integrated circuit package comprises: means for processing data; means for housing at least a portion of the means for processing; means for supporting the means for housing; support means for bearing at least part of a load placed on the integrated circuit package, where the support means comprises flexible means for supporting at least part of the load, and where a state of the flexible means is dependent on a position of the support means.

Other aspects and advantages of the invention will be apparent from the following description and the appended claims.

BRIEF DESCRIPTION OF DRAWINGS

FIG. 5b shows a cross-section of a second state of the "lidless" integrated circuit package shown in FIG. 5a.

FIG. 6 shows a cross-section of an integrated circuit package in accordance with an embodiment of the present invention.

FIG. 7a shows a top view of a support member usable in the embodiment shown in FIG. 6.

FIG. 7b shows a flexible support device of the support member shown in FIG. 7a.

FIG. 8b shows a cross-section of a second state of the integrated circuit package shown in FIG. 8a.

DETAILED DESCRIPTION

Figure 1:
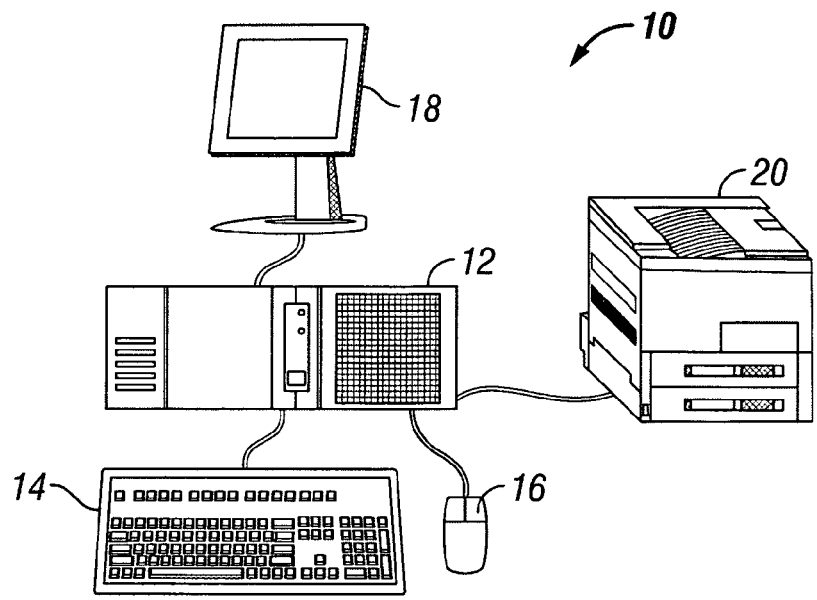
FIG. 1 shows a typical computer system.
Figure 2:
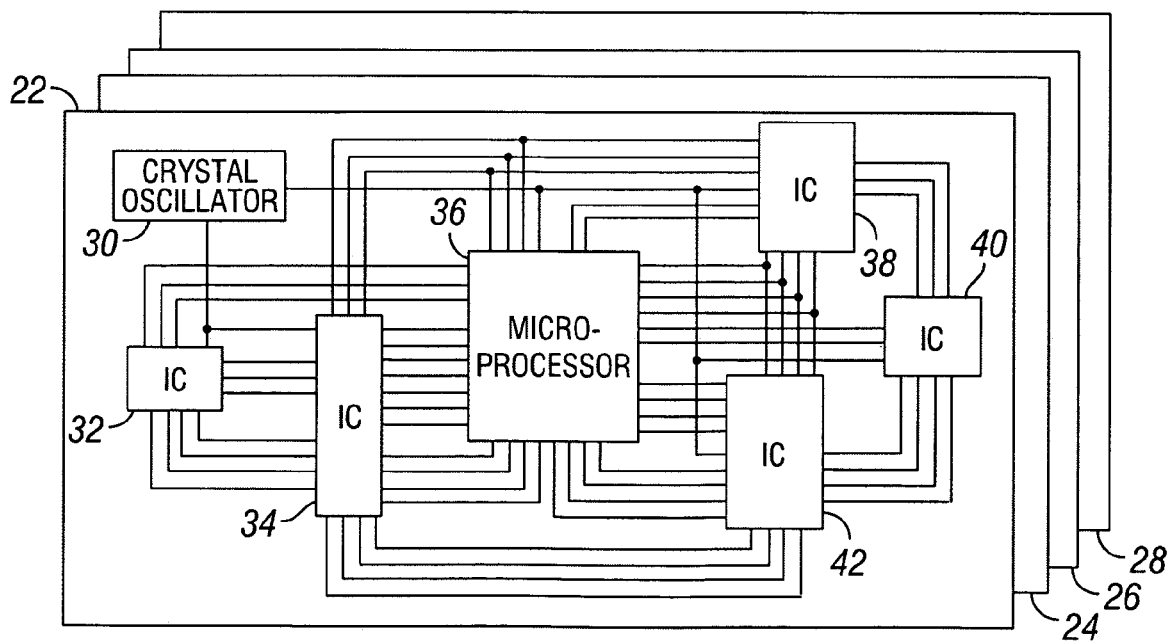
FIG. 2 shows a typical circuit board.
Figure 3:
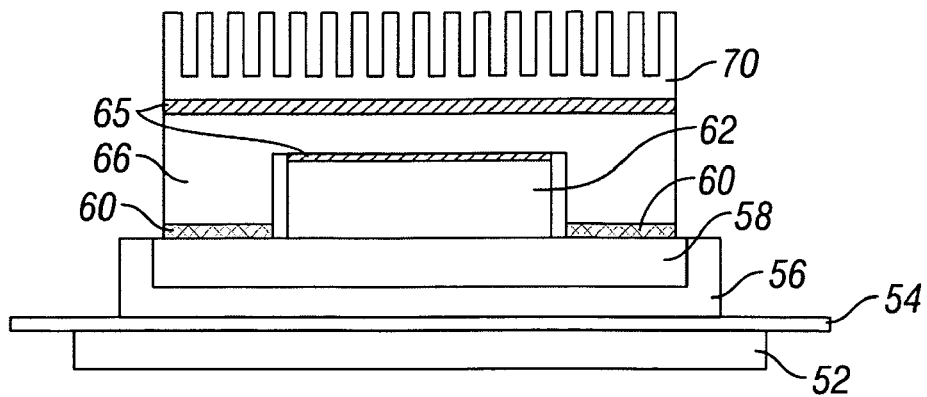
FIG. 3 shows a cross-section of a "lidded" integrated circuit package.

FIG. 3 shows an integrated circuit package. In FIG. 3, a semiconductor die 62 having an integrated circuit is disposed on a substrate 58 embedded in a socket 56. The socket 56 is electrically connected to a circuit board 54 that is supported by a bolster plate 52. The substrate 58 has electrically conductive paths called "vias" that are arranged to pass signals between the circuit board 54 and the integrated circuit fabricated on the semiconductor die 62.

The semiconductor die 62 is peripherally surrounded by a lidded frame 66 that is attached to the substrate 58 by an adhesive 60. A portion of the lidded frame 66 is also disposed over, and is in operative contact with, the semiconductor die 62. Due to the operative contact between the semiconductor die 62 and the lidded frame 66, heat emanating from the semiconductor die 62 transfers first to the lidded frame 66 and then to a heat dissipation device 70 that is attached to the lidded frame 66. Further, due to the flatness and/or roughness of any of the semiconductor die 62, lidded frame 66, and the heat dissipation device 70, thermal interface material 65 used to ensure heat transfer is disposed between the semiconductor die 62 and the lidded frame 66 and between the lidded frame 66 and the heat dissipation device 70.

FIG. 3 shows what is known in the art as a "lidded" integrated circuit package due to the presence of the lidded frame 66 disposed over and around the semiconductor die 62. Although such a lidded frame 66 is useful for supporting and distributing loads placed on the semiconductor die 62 and the substrate 58, the lidded frame 66 adds a thermal interface layer that increases the thermal resistance of the integrated circuit package. In other words, the transfer of heat from the semiconductor die 62 to the heat dissipation device 70 experiences increased thermal resistance due to the presence of the lidded frame 66 as opposed to arrangements in which a lidded frame 66 is not present—such integrated circuit packages known in the art as "lidless" integrated circuit packages.

Figure 4:
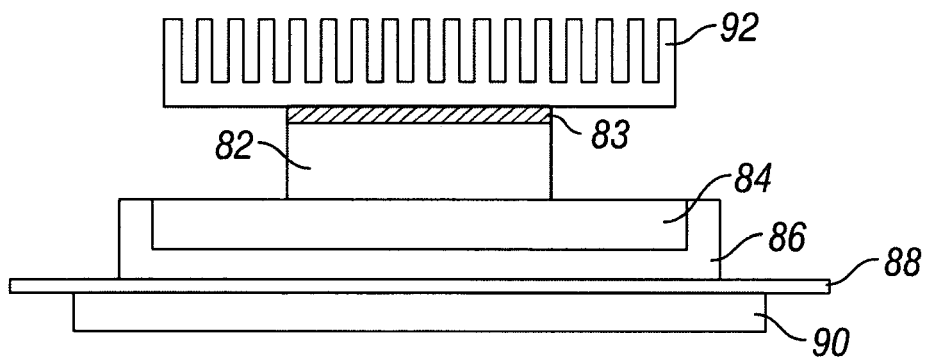
FIG. 4 shows a cross-section of a "lidless" integrated circuit package.

FIG. 4 shows a typical "lidless" integrated circuit package. In FIG. 4, a semiconductor die 82 having an integrated circuit is disposed on a substrate 84 embedded in a socket 86. The socket 86 is electrically connected to a circuit board 88 that is supported by a bolster plate 90. In order to dissipate heat emanating from the semiconductor die 82, a heat dissipation device 92 is disposed over, and is in operative contact with, the semiconductor die 82. Further, thermal interface material 83 used to ensure heat transfer is disposed between the semiconductor die 82 and the heat dissipation device 92.

One skilled in the art will recognize that due to the lack of any structure between the substrate 84 and the heat dissipation device 92 other than the semiconductor die 82, the entire load above the semiconductor die 82 is placed on the semiconductor die 82. Without any structure such as the lidded frame 66 shown in FIG. 3 to support and distribute potentially high loads placed on the semiconductor die 62 and the substrate 58, such loads may adversely impact the integrity and/or operation of the semiconductor die 82 and/or the integrated circuit fabricated thereon.

Figure 5A:
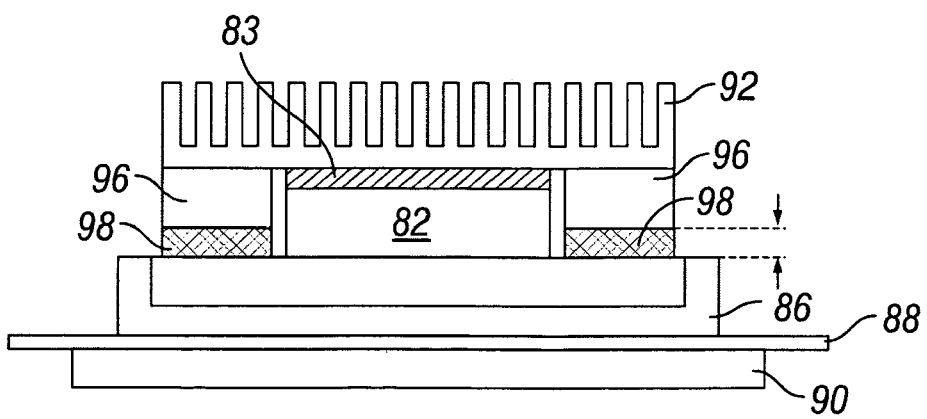
FIG. 5a shows a cross-section of a first state of a "lidless" integrated circuit package.

One technique used in the art to more evenly distribute the high loads placed on a semiconductor die in a "lidless" integrated circuit package involves the placement of a support member between the substrate and the load source (e.g., heat dissipation device). For example, as shown in FIG. 5a, a support member (e.g., stiffener) 96 is attached to the substrate 84 by an adhesive 98. The support member 96 is in operative contact with the heat dissipation device 92 so as to distribute the load of the heat dissipation device 92 more evenly across the substrate 84 as opposed to the arrangement in which the entire load is distributed through the semiconductor die 82 as shown in FIG. 4.

However, the load distribution in the integrated circuit package shown in FIG. 5a may be affected by the fabrication and/or operation of the integrated circuit package. During the fabrication process or during operation, the integrated circuit package may be subject to high temperatures that cause the adhesive 98 to soften and spread out, thereby resulting in the reduction of the thickness 100 of the adhesive 98 as shown in FIG. 5b. When the thickness 100 of the adhesive 98 decreases, the support member 96 attached to the substrate 84 by that adhesive 98 shifts toward the substrate 84. This shifting of the support member 96 may ruin the desired co-planarity of the surfaces of the support member 96 and the semiconductor die 82 facing the heat dissipation device 92 that previously existed before the reduction in the thickness 100 of the adhesive 98 (as shown in FIG. 5a). Because the plane of the surface of the support member 96 facing the heat dissipation device 92 is not in the same plane as the plane of the surface of the semiconductor die 82 facing the heat dissipation device 92, the support member 96 is no longer positioned to support part of the load of the heat dissipation device 92, and, therefore, load of the heat dissipation device 92 is re-distributed and placed onto the semiconductor die 82 similar to the load distribution shown in FIG. 4.

Accordingly, at least in view of the increased thermal resistance associated with typical "lidded" integrated circuit packages as discussed above with reference to FIG. 3 and the potential undesired load distribution associated with typical "lidless" integrated circuit packages as discussed above with reference to FIGS. 4 and 5b, embodiments of the present invention relate to a "lidless" integrated circuit package that is arranged to substantially ensure desired load distribution. In other words, embodiments of the present invention relate to an integrated circuit package that does not have a thermal resistance layer created by the presence of a lidded frame around the semiconductor die while, at the same time, has a support member that supports at least part of a load placed on the integrated circuit package even when a position of the support member changes during fabrication and/or operation of the integrated circuit package.

FIG. 6 shows an exemplary integrated circuit package in accordance with an embodiment of the present invention. In FIG. 6, a semiconductor die 110 having an integrated circuit is disposed on a substrate 112 embedded in a socket 114. The socket 114 is electrically connected to a circuit board 116 that is supported by a bolster plate 118. In order to dissipate heat emanating from the semiconductor die 110, a heat dissipation device 120 with thermal interface material 111 is disposed over and in operative contact with the semiconductor die 110.

To support at least part of the load of the heat dissipation device 120, a support member 122 is attached to the substrate 112 by an adhesive 124 and has a flexible support device 126 such as, for example, a spring, that is in operative contact with the heat dissipation device 120. The flexible support device 126 is designed to flex (e.g., contract and expand) depending on a position of the support member 122 as discussed in further detail below with reference to FIGS. 8a and 8b.

FIG. 7a shows an exemplary support member 122 usable in the integrated circuit package shown in FIG. 6. As shown in FIG. 7a, the support member 122 has a plurality of flexible support devices 126 that are partially embedded within the support member 122.

FIG. 7*b* shows the configuration of an exemplary flexible support device 126. The flexible support device 126 is designed to contract when a load is placed upon it and to expand when a load begins to be removed from it so as to ensure the continued support of at least part of the load by the flexible support device 126 and the support member 122. In other words, because a top surface plane of the flexible support device 126 is substantially co-planar with a surface of a semiconductor die, the flexible support device 126 ensures that despite changes in the position of the support member 122 attached to the flexible support device 126, load is more evenly distributed across the semiconductor die and a substrate relative to those structures having no flexible support device.

Although the embodiment of the support member 122 shown in FIG. 7*a* is designed to peripherally surround a semiconductor die, in one or more embodiments of the present invention, a support member consistent with the claimed invention may not peripherally surround the semiconductor die. For example, in one or more embodiments of the present invention, there may be a plurality of support members having flexible support devices distributed between the substrate and a load source.

Further, in one or more embodiments of the present invention, flexible support devices having different configurations from that shown in FIGS. 7*a* and 7*b* may be used.

Further, in one or more other embodiments of the present invention, a flexible support device may be positioned wholly outside a support member as long as the support member is in supportive contact with the flexible support device.

Figure 8A:
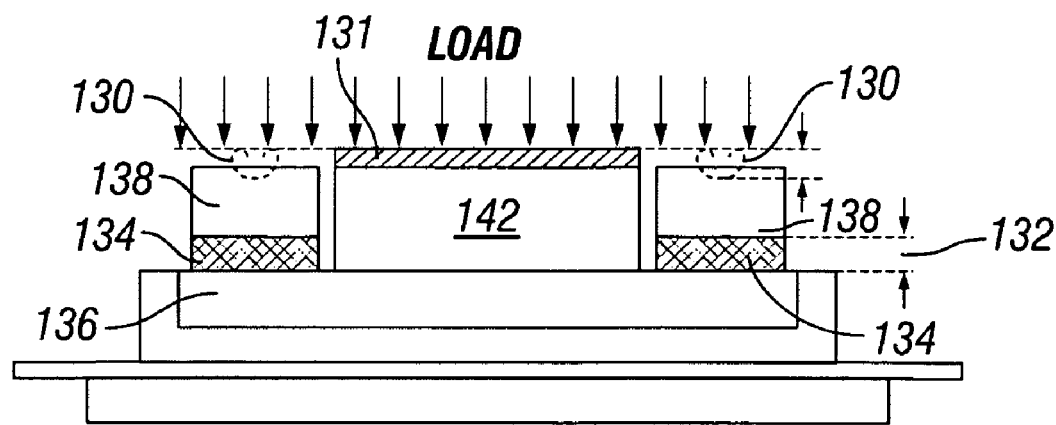
FIG. 8a shows a cross-section of a first state of an integrated circuit package in accordance with an embodiment of the present invention.
Figure 8B:
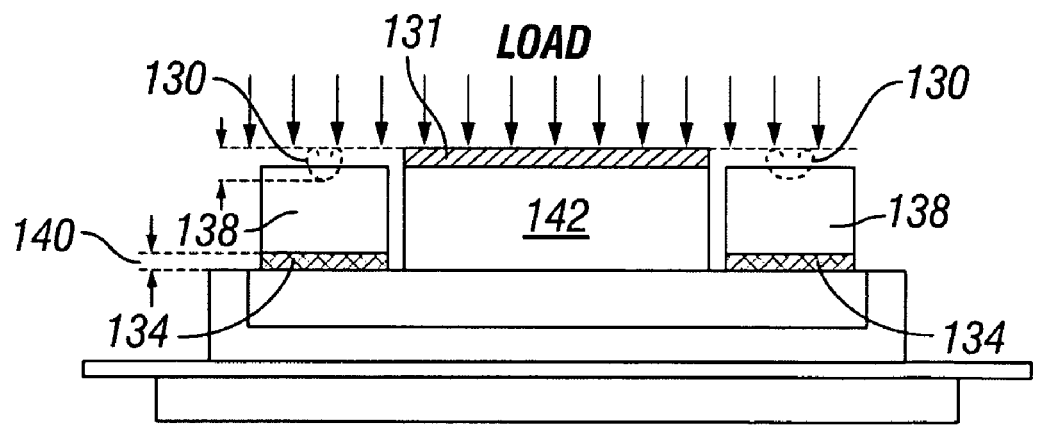

FIGS. 8*a* and 8*b* respectively show the operation of a flexible support device 130 (i) prior to a reduction in thickness 132 of an adhesive layer 134 used to attach a substrate 136 and a support member 138 having the flexible support device 130 and (ii) after a reduction in thickness 140 of the adhesive layer 134. As shown in FIGS. 8*a* and 8*b*, when the thickness of the adhesive layer 134 decreases, the flexible support device 130 expands so as to stay in supportive contact with the load source LOAD. In such an arrangement, load continues to be evenly distributed due to the co-planarity of the plane of the surface of the semiconductor die 142 and the plane of the surface of the flexible support device 130.

Advantages of the present invention may include one or more of the following. In one or more embodiments of the present invention, an integrated circuit package is "lidless," thereby having a decreased thermal resistance.

In one or more embodiments of the present invention, an integrated circuit package has a support member that is used to support at least part of a load placed on the integrated circuit package.

In one or more embodiments of the present invention, an integrated circuit package includes a support member having a flexible support device that is arranged to support at least part of a load placed on the integrated circuit package even if a position of the support member changes during fabrication or operation of the integrated circuit package.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An apparatus, comprising:
   a substrate;
   a semiconductor die disposed on the substrate and having an integrated circuit electrically connected to the substrate;
   a load source, at least part of which is disposed over and in operative contact with semiconductor die;
   a support member disposed on the substrate; and
   a flexible support device connected to the support member and in operative contact with the load source,
   wherein the flexible support device is partially embedded within the support member.

2. The apparatus of claim 1, wherein the flexible support device is arranged to flex dependent on a position of the support member relative to the semiconductor die.

3. The apparatus of claim 1, wherein the flexible support device is a spring.

4. The apparatus of claim 1, wherein the load source comprises a heat dissipation device.

5. The apparatus of claim 4, wherein the heat dissipation device is arranged to dissipate heat emanating from the semiconductor die.

6. The apparatus of claim 1, wherein an active side of the semiconductor die is disposed facing the substrate.

7. An apparatus, comprising:
   a substrate;
   a semiconductor die disposed on the substrate and having an integrated circuit electrically connected to the substrate;
   a load source, at least part of which is disposed over and in operative contact with semiconductor die;
   a support member disposed on the substrate; and
   a flexible support device connected to the support member and in operative contact with the load source,
   wherein the support member is a stiffener.

8. An apparatus, comprising:
   a substrate;
   a semiconductor die disposed on the substrate and having an integrated circuit electrically connected to the substrate;
   a load source, at least part of which is disposed over and in operative contact with semiconductor die;
   a support member disposed on the substrate; and
   a flexible support device connected to the support member and in operative contact with the load source,
   wherein the support member peripherally encloses the semiconductor die.

9. An apparatus, comprising:
   a substrate;
   a semiconductor die disposed on the substrate and having an integrated circuit electrically connected to the substrate;
   a load source, at least part of which is disposed over and in operative contact with semiconductor die;
   a support member disposed on the substrate;
   a flexible support device connected to the support member and in operative contact with the load source, and
   an adhesive disposed between the substrate and the support member.

10. A computer system, comprising:
    a circuit board;
    a substrate electrically connected to the circuit board, the substrate having electrically conductive paths arranged to pass signals between the circuit board and an integrated circuit;

a semiconductor die disposed on the substrate and having the integrated circuit fabricated thereon, wherein a load source is disposed over the semiconductor die; and a support member attached to the substrate and connected to a flexible support device in supportive contact with the load source, wherein the flexible support device is partially embedded in the support member.

11. The computer system of claim 10, wherein the flexible support device is arranged to flex dependent on a change to a position of the support member.

12. The computer system of claim 10, wherein the flexible support device is a spring.

13. The computer system of claim 10, wherein the support member peripherally surrounds the semiconductor die.

14. The computer system of claim 10, further comprising:
a layer of adhesive arranged to attach the support member and the substrate.

15. The computer system of claim 10, wherein the load source comprises a heat dissipation device.

16. An integrated circuit package, comprising:
means for processing data;
means for housing at least a portion of the means for processing;
means for supporting the means for housing;
support means for bearing at least part of a load placed on the integrated circuit package; and
flexible means connected to the support means for supporting the at least part of the load,
wherein a state of the flexible means is dependent on a position of the support means, and
wherein the flexible means is at least partially embedded in the support means.

17. The integrated circuit package of claim 16, wherein the support means peripherally surrounds the means for housing.

18. The integrated circuit package of claim 16, further comprising:
means for attaching the support means to the means for supporting the means for housing.

* * * * *